United States Patent
Ji et al.

(10) Patent No.: US 11,227,939 B2
(45) Date of Patent: Jan. 18, 2022

(54) SEMICONDUCTOR STRUCTURE WITH GROOVES AND FORMING METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventors: Shiliang Ji, Shanghai (CN); Haiyang Zhang, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 16/736,921

(22) Filed: Jan. 8, 2020

(65) Prior Publication Data
US 2020/0219992 A1    Jul. 9, 2020

(30) Foreign Application Priority Data
Jan. 9, 2019    (CN) .......................... 201910019354.3

(51) Int. Cl.
*H01L 29/66* (2006.01)
*H01L 21/8234* (2006.01)
(Continued)

(52) U.S. Cl.
CPC .. *H01L 29/6681* (2013.01); *H01L 21/823431* (2013.01); *H01L 27/0886* (2013.01); *H01L 29/785* (2013.01)

(58) Field of Classification Search
CPC ......... H01L 29/6681; H01L 21/823431; H01L 27/0886; H01L 29/785; H01L 21/30604; H01L 29/66795–66818; H01L 27/0924; H01L 2029/7858; H01L 29/66818; H01L 29/7855–7856; H01L 27/1211; H01L 27/10826; H01L 27/10879;
(Continued)

(56) References Cited

U.S. PATENT DOCUMENTS 9,455,198 B1 * 9/2016 Yu .................... H01L 21/823431
2015/0325572 A1 * 11/2015 Cheng ................. H01L 27/0629
257/369

(Continued)

*Primary Examiner* — Mohammad M Hoque
(74) *Attorney, Agent, or Firm* — Anova Law Group, PLLC

(57) ABSTRACT

Semiconductor structure and method of forming a semiconductor structure are provided. A substrate is provided, including a first region and a second region that are adjacent to each other and arranged in a first direction. Fins are disposed on a surface of the substrate at the first region, and first openings are located between adjacent fins. The fins include fins to-be-removed. A first dielectric layer is formed on sidewalls of the fins. The first dielectric layer fills the first openings. A first groove is formed in the substrate at the second region by etching the substrate at the second region using the first dielectric layer as a mask. After forming the first groove, a second groove is formed in the substrate at the first region by removing the fins to-be-removed and a portion of the substrate located at bottoms of the fins to-be-removed.

18 Claims, 7 Drawing Sheets

(51) Int. Cl.
*H01L 27/088* (2006.01)
*H01L 29/78* (2006.01)

(58) Field of Classification Search
CPC ..... H01L 2924/13067; H01L 29/14791; H01L 21/823821; H01L 21/845; C23C 16/45525; C23C 16/345; C23C 16/401
USPC ........................................................ 257/288
See application file for complete search history.

(56) References Cited

U.S. PATENT DOCUMENTS

| | | | |
|---|---|---|---|
| 2018/0040703 A1* | 2/2018 | Chang | H01L 29/7853 |
| 2018/0040713 A1* | 2/2018 | Chang | H01L 27/0886 |
| 2020/0006324 A1* | 1/2020 | Chen | H01L 24/09 |
| 2020/0176303 A1* | 6/2020 | Yang | H01L 27/1104 |

* cited by examiner

SEMICONDUCTOR STRUCTURE WITH GROOVES AND FORMING METHOD THEREOF

CROSS-REFERENCES TO RELATED APPLICATIONS

This application claims priority of Chinese Patent Application No. 201910019354.3, filed on Jan. 9, 2019, the entire content of which is hereby incorporated by reference.

FIELD OF THE DISCLOSURE

The present disclosure generally relates to the field of semiconductor technologies and, more particularly, relates to a semiconductor structure and a forming method thereof.

BACKGROUND

As integration levels of semiconductor devices increase, critical dimensions of transistors continuously shrink. Design of three-dimensional structures such as a fin field effect transistor (FinFET) has become a hot spot in the field of semiconductor technologies. A fin field effect transistor is an emerging multi-gate device, and generally has a plurality of thin fins extending vertically upward from a substrate. A channel of the fin field effect transistor may be formed in the fins, and a gate structure may be formed on the fins. An active region and a drain region may be formed in the fins at two sides of the gate structure, and adjacent fins may be isolated by isolation structures.

With continuous miniaturization of semiconductor devices, to fabricate smaller and more densely distributed fins, new techniques have emerged for fabrication of isolation structures. For example, a single diffusion break (SDB) isolation structure is generally distributed along a length direction of a fin. In a fabrication technique of an SDB isolation structure, by removing certain regions of a fin, one partition groove or a plurality of partition grooves may be formed in the fin. After filling the grooves with an insulating material such as silicon dioxide, the fin may be partitioned into a plurality of small fins.

A fabrication process of an SDB isolation structure and a structure quality of the SDB isolation structure formed may affect isolation performance of the SDB isolation structure, and may even cause defects in surrounding fins and gate structures. Thus, performance of a fin field effect transistor device may be affected.

The disclosed methods and structures are directed to solve one or more problems set forth above and other problems in the art.

BRIEF SUMMARY OF THE DISCLOSURE

One aspect of the present disclosure includes a method of forming a semiconductor structure. The method includes providing a substrate. The substrate includes a first region and a second region that are adjacent to each other. The first region and the second region are arranged in a first direction and the first direction is parallel to a surface of the substrate. The method also includes providing a plurality of fins on the substrate at the first region. First openings are located between adjacent fins. A dimension of the second region is larger than a dimension of a first opening in the first direction, and the plurality of fins includes fins to-be-removed. The method also includes forming a first dielectric layer on sidewalls of the fins. The first dielectric layer fills the first openings. The method also includes forming a first groove in the substrate at the second region by etching the substrate at the second region using the first dielectric layer as a mask. The method also includes, after forming the first groove, forming a second groove in the substrate at the first region by removing the fins to-be-removed and a portion of the substrate located at bottoms of the fins to-be-removed.

Another aspect of the present disclosure includes a semiconductor structure. The semiconductor structure is formed by a method including providing a substrate. The substrate includes a first region and a second region that are adjacent to each other. The first region and the second region are arranged in a first direction and the first direction is parallel to a surface of the substrate. The method also includes providing a plurality of fins on the substrate at the first region. First openings are located between adjacent fins. A dimension of the second region is larger than a dimension of a first opening in the first direction, and the plurality of fins includes fins to-be-removed. The method also includes forming a first dielectric layer on sidewalls of the fins. The first dielectric layer fills the first openings. The method also includes forming a first groove in the substrate at the second region by etching the substrate at the second region using the first dielectric layer as a mask. The method also includes, after forming the first groove, forming a second groove in the substrate at the first region by removing the fins to-be-removed and a portion of the substrate located at bottoms of the fins to-be-removed.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

To make the objectives, technical solutions and advantages of the present disclosure more clear and explicit, the present disclosure is described in further detail with accompanying drawings and embodiments. It should be understood that the specific exemplary embodiments described herein are only for explaining the present disclosure and are not intended to limit the present disclosure.

Reference will now be made in detail to exemplary embodiments of the present disclosure, which are illustrated in the accompanying drawings. Wherever possible, the same reference numbers will be used throughout the drawings to refer to the same or like parts.

An appearance of a groove formed by a conventional technology in a substrate with uneven fins may be undesirable.

FIGS. 1 to 4 illustrate semiconductor structures corresponding to certain stages of forming a semiconductor structure.

Figure 1:
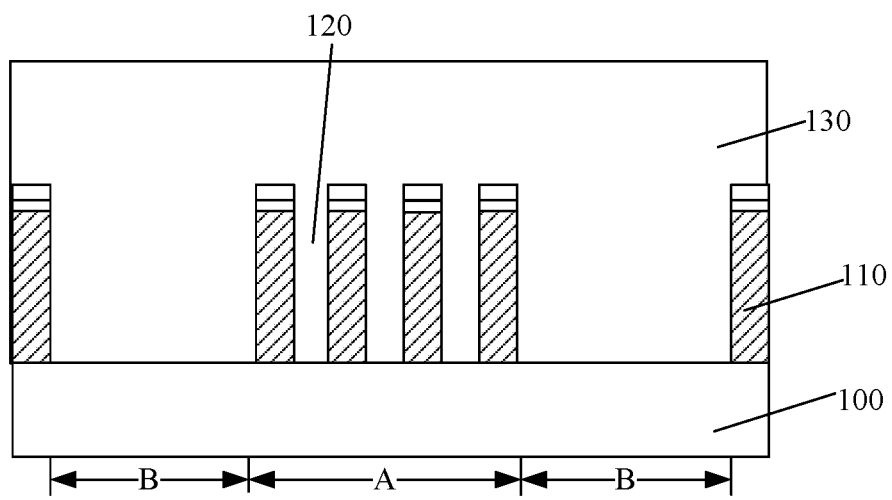
FIGS. 1 to 4 illustrate semiconductor structures corresponding to certain stages of forming a semiconductor structure.

As shown in FIG. 1, a substrate 100 is provided. The substrate 100 includes a first region A and a second region B that are adjacent to each other. The first region A and the second region B are aligned in a first direction. The first direction is parallel to a surface of the substrate 100. The surface of the substrate 100 at the first region A is disposed with a plurality of fins 110, and a plurality of first openings 120 are located between adjacent fins 110. In the first direction, a dimension of the second region B is larger than a dimension of the first opening 120. A first dielectric layer 130 is disposed on the surface of the substrate 100, and top surfaces and sidewall surfaces of the fins 110. The first dielectric layer 130 fills the first openings 120, and a top surface of the first dielectric layer 130 is higher than the top surfaces of the fins 110.

Figure 2:
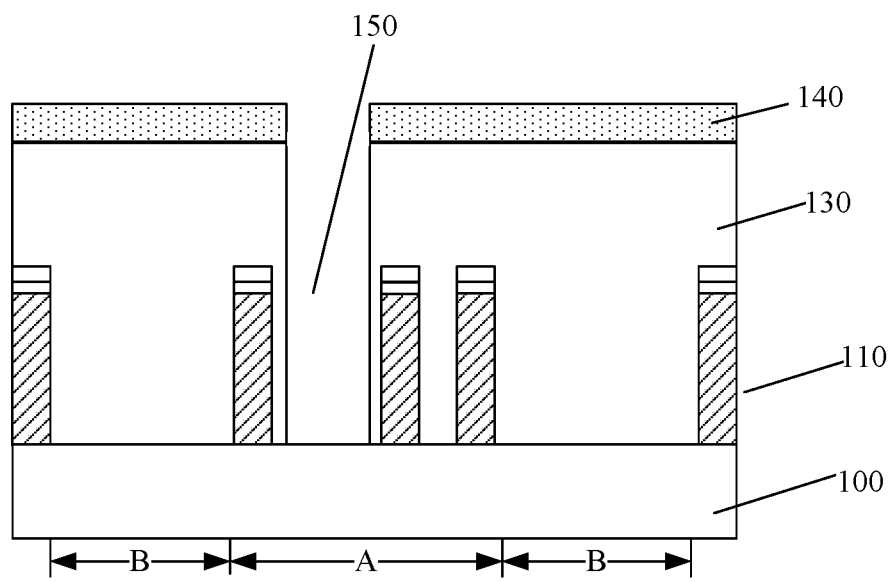

Referring to FIG. 2, a first mask layer 140 is formed on the top surface of the first dielectric layer 130, and the first mask layer 140 exposes a portion of the top surface of the first dielectric layer 130 at the first region A. By using the first mask layer 140 as a mask, the first dielectric layer 130 and the fins 110 are etched until the surface of the substrate 100 is exposed, and a second opening 150 is thus formed in the first dielectric layer 130.

Figure 3:
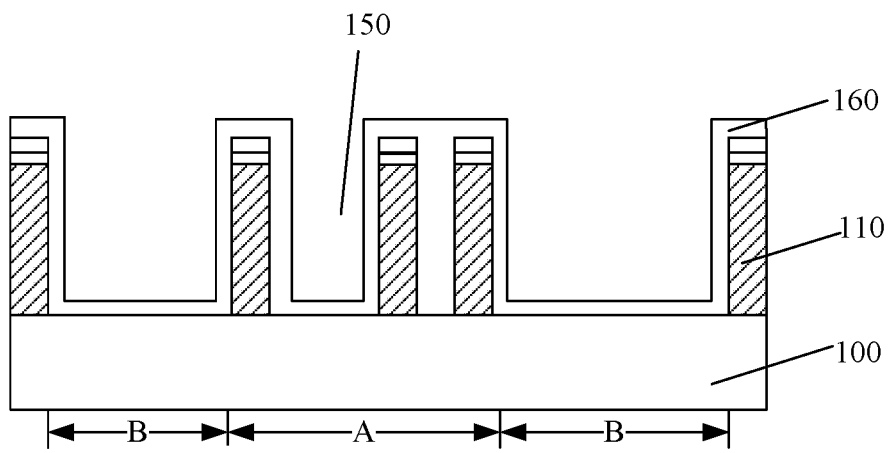

Referring to FIG. 3, the first dielectric layer 130 and the first mask layer 140 on the top surface of the first dielectric layer 130 are removed. A second dielectric film 160 is formed on a bottom surface of the second opening 150, tops and sidewalls of the fins 110, and the surface of the substrate 100. The second dielectric film 160 fills the first openings 120.

Figure 4:
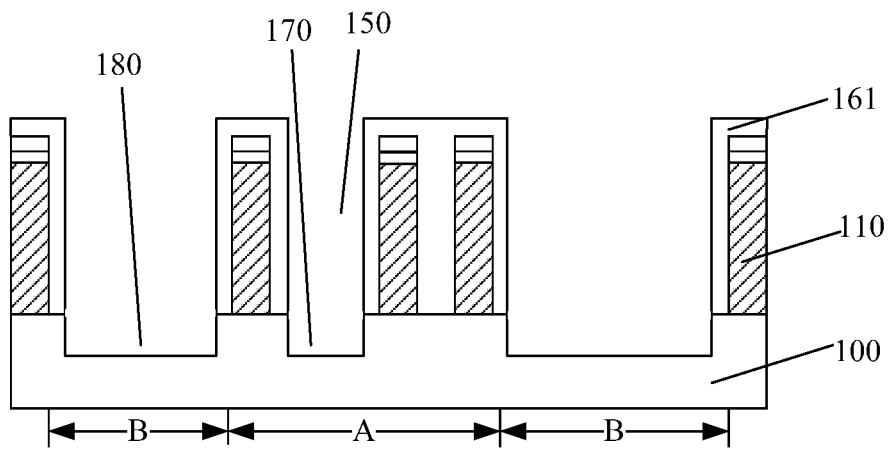

Referring to FIG. 4, the second dielectric film 160 is etched back until the surface of the substrate 100 is exposed, and thus a second dielectric layer 161 is formed. The substrate 100 is etched by using the second dielectric layer 161 as a mask, such that a first groove 170 is formed in the substrate 100 at the first region A, and a second groove 180 is formed in the substrate 100 at the second region B.

In the above method, by using the first mask layer 140 as the mask, at least one fin 110 on the surface of the first region A is removed, such that the second opening 150 is formed between adjacent fins 110 in the first region A. After the second opening 150 is formed, by using the second dielectric layer 161 as the mask, the substrate 100 located at the bottom of the second opening 150 at the first region A and the substrate 100 at the second region B are removed. As a result, the first groove 170 is formed in the substrate 100 at the first region A, and the second groove 180 is formed in the substrate 100 at the second region B. The first groove 170 is located at the bottom of the second opening 150, However, when the second opening 150 is formed by etching the first dielectric layer 130 and the fin 110 using the first mask layer 140 as the mask, the surface of the substrate 100 at the first region A may have certain residual material of the fin 110. Accordingly, an appearance of the bottom of the second opening 150 formed may be undesirable. The second dielectric film 160 subsequently formed covers a bottom surface of the second opening 150, the tops and the sidewalls of the fins 110, and the surface of the substrate 100. When the second dielectric film 160 is etched back to form the second dielectric layer 161, due to influence of the residual material of the fin 110, certain material of the second dielectric film may remain on the bottom surface of the second opening 150. As such, when the substrate 100 is etched, by using the second dielectric layer 161 as the mask, to form the second groove 180 in the substrate 100 at the second region B, defects existing on the bottom surface of the second opening 150 may be further strengthened by the etching process to form the second groove. Accordingly, an appearance of the first groove 170 formed in the substrate 100 at the first region A may be undesirable, and a semiconductor structure formed may not have good performance.

To solve the above technical problem, the present disclosure provides a method for forming a semiconductor device. The method includes etching a substrate at a second region by using a first dielectric layer as a mask to form a first groove in the substrate at the second region. The method also includes removing a fin to-be-removed and a portion of the substrate at a bottom of the fin to-be-removed to form a second groove in the substrate at the first region. The first groove and the second groove are formed step by step. First, the first groove is formed in the substrate at the second region, and then the second groove is formed in the substrate at the first region. Accordingly, dimensions of the first groove and the second groove in a first direction may be different, the first direction being parallel to a surface of the substrate, and both the first groove and the second groove may have a good appearance. Thus, the semiconductor structure formed may have good performance.

Figure 10:
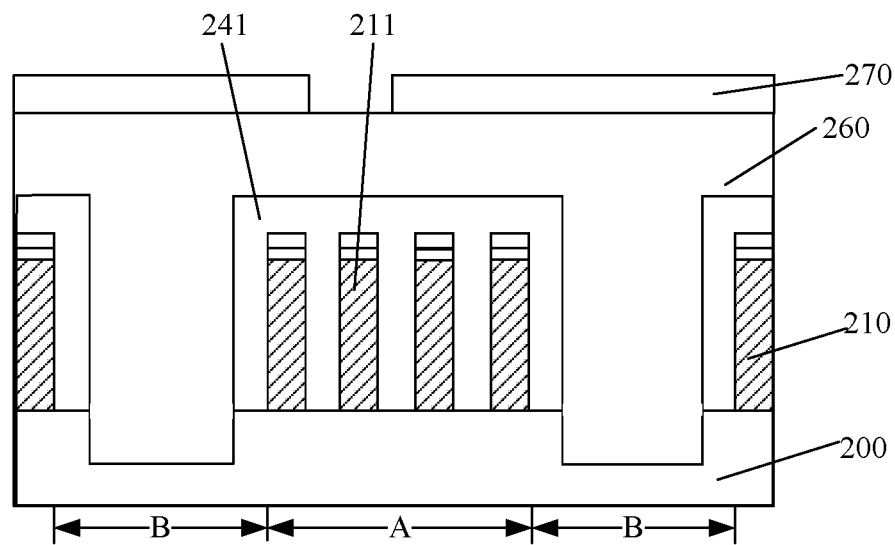
Figure 11:
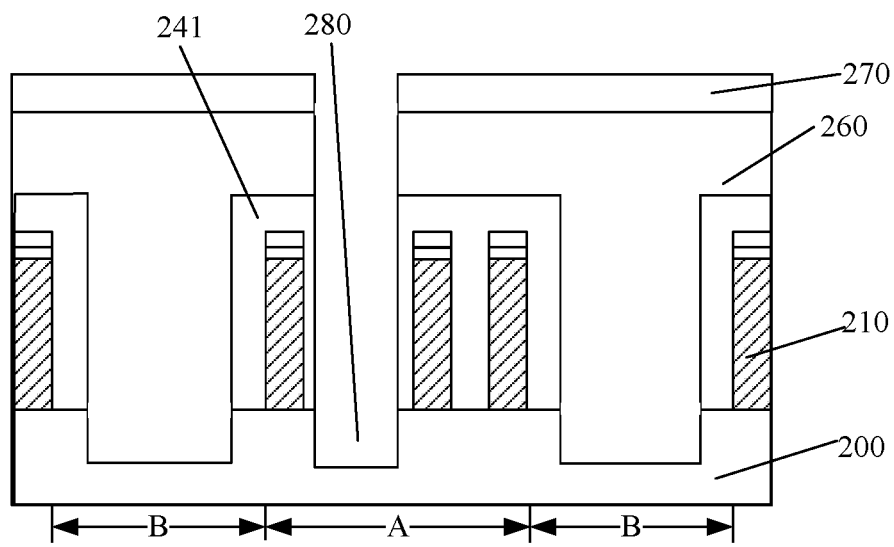
Figure 12:
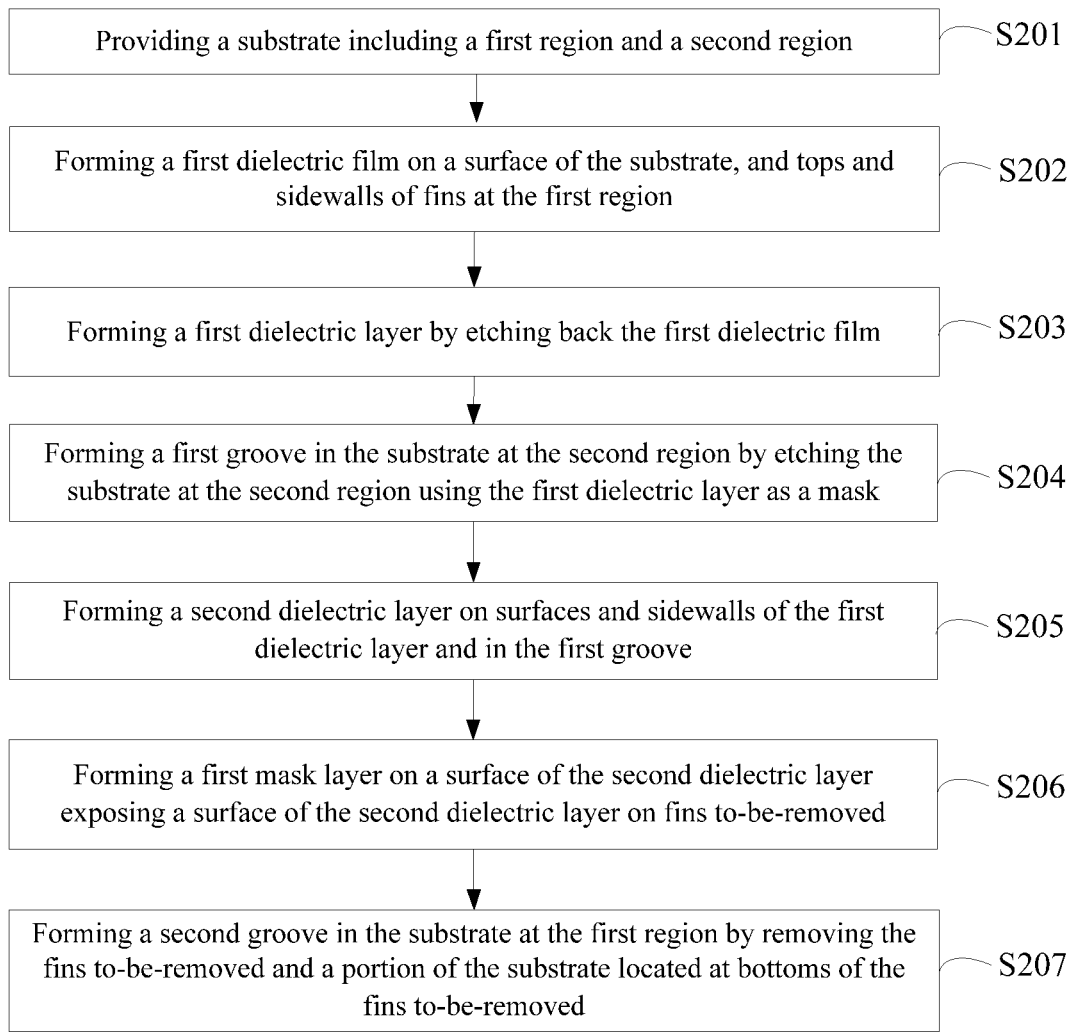
FIG. 12 illustrates an exemplary process of forming a semiconductor structure consistent with the disclosed embodiments of the present disclosure.

FIG. 12 illustrates an exemplary process of forming a semiconductor structure consistent with the disclosed embodiments of the present disclosure. FIGS. 5 to 11 illustrate semiconductor structures corresponding to certain stages of the exemplary process of forming the semiconductor structure.

Figure 5:
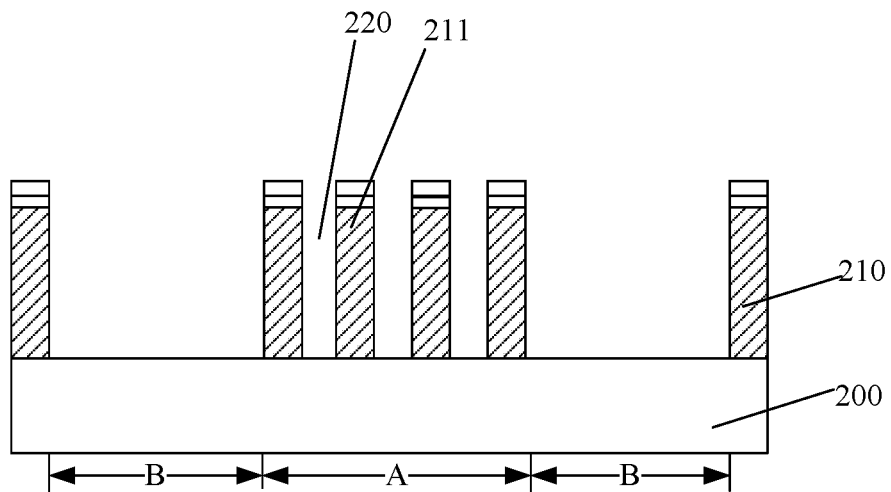
FIGS. 5 to 11 illustrate semiconductor structures corresponding to certain stages of an exemplary process of forming a semiconductor structure consistent with the disclosed embodiments of the present disclosure.

As shown in FIG. 12, at the beginning of the process of forming the semiconductor structure, a substrate is provided (S201). FIG. 5 illustrates a corresponding semiconductor structure. As show in FIG. 5, the substrate 200 includes a first region A and a second region B that are adjacent to each other. The first region A and the second region B are arranged in a first direction. The first direction is parallel to a surface of the substrate. A plurality of fins 210 are disposed on the surface of the substrate 200 at the first substrate A. First openings 220 are located between adjacent fins 210. In the first direction, a dimension of the second region B is larger than a dimension of the first opening 220. The plurality of fins 210 includes fins to-be-removed 211.

In one embodiment, width direction of fins 210 is parallel to the first direction, and fins 210 are arranged along the first direction.

The substrate 200 may be made of a material including single crystal silicon, polysilicon, or amorphous silicon. The substrate may also be made of a semiconductor material including germanium, silicon germanium or gallium arsenide. The substrate may also be made of a semiconductor-on-insulator structure including an insulator and a semiconductor material layer on the insulator. The semiconductor material layer may be made of a semiconductor material including silicon, germanium, silicon germanium, gallium arsenide or indium gallium arsenide.

In one embodiment, the substrate 200 is made of single crystal silicon, and the fins 210 and the substrate 200 are made of a same material. That is, the fins 210 are made of single crystal silicon.

One or a plurality of fins to-be-removed 211 may be disposed on the substrate 200. In one embodiment, one fin to-be-removed 211 is disposed on the substrate 200.

In one embodiment, a first protective layer (not labelled) is disposed on top surfaces of the fins 210, and a second protective layer (not labelled) is disposed on a surface of the first protective layer. The first protective layer on the top surfaces of the fins 210 may be used as a stop layer in a subsequent etching process. The second protective layer on the surface of the first protective layer may protect the first protective layer, preventing the first protective layer from being damaged in a subsequent process, and thus the first protective layer may have a flat surface. Accordingly, the first protective layer may be subsequently used as a stop layer in an etching process.

The first protective layer is made of a material including silicon oxide, silicon nitride, silicon carbonitride, silicon carbide, aluminum oxide, hafnium oxide, silicon oxynitride or silicon oxycarbide. In one embodiment, the first protective layer is made of silicon nitride.

The second protective layer is made of a material including silicon oxide, silicon nitride, silicon carbonitride, silicon carbide, aluminum oxide, hafnium oxide, silicon oxynitride or silicon oxycarbide. The second protective layer and the first protective layer are made of different materials. In one embodiment, the second protective layer is made of silicon oxide.

Figure 6:
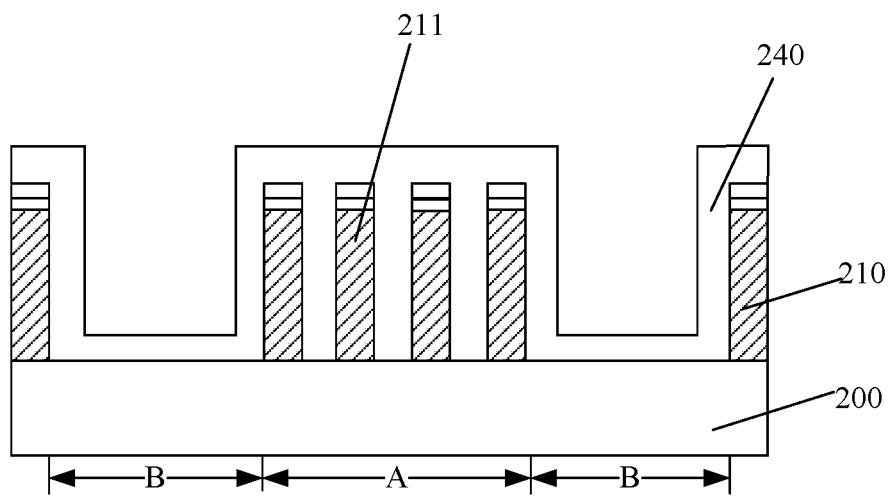
Figure 7:
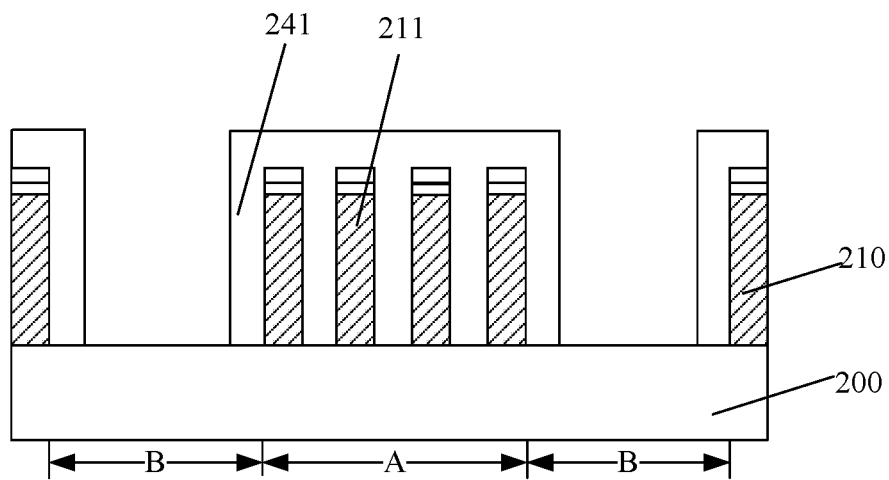

In one embodiment, a first dielectric layer is formed on sidewalls of the fins 210, and the first dielectric layer fills the first opening 220. FIG. 6 to FIG. 7 illustrate semiconductor structures corresponding to certain stages of forming the first dielectric layer.

Returning to FIG. 12, after the substrate is provide, a first dielectric film 240 is formed on the surface of the substrate 200, the tops and the sidewalls of the fins 210 (S202). FIG. 6 illustrates a corresponding semiconductor structure. As shown in FIG. 6, the first dielectric film 240 fills the first opening 220. The first dielectric film 240 may be used to subsequently form a first dielectric layer.

The first dielectric film 240 is made of a material including silicon oxide, silicon nitride, silicon carbonitride, silicon carbide, aluminum oxide, hafnium oxide, silicon oxynitride or silicon oxycarbide. In one embodiment, the first dielectric film 240 is made of silicon oxide, and correspondingly, the first dielectric layer subsequently formed is made of silicon oxide.

A process of forming the first dielectric film 240 includes a chemical vapor deposition process, a physical vapor deposition process, or an atomic layer deposition process.

In the first direction, the first dielectric film 240 has a dimension in a range of approximately 1 nm to 10 nm, and the first opening 220 between the fins 210 has a dimension in a range of approximately 1 nm to 10 nm.

In one embodiment, the process of forming the first dielectric film 240 is the atomic layer deposition process. A film formed by the atomic layer deposition process may have a good step coverage. By using the atomic layer deposition process, the first dielectric film 240 formed may be thick enough to fill the first openings between the fins 210 at the first region A. At the same time, a first dielectric layer having a good appearance and a large thickness may be subsequently formed by etching back the first dielectric film 240. Accordingly, when an etching process is performed by using the first dielectric layer as a mask, a first groove having a good appearance may be formed in the substrate 200 at the second region B, such that the semiconductor structure formed may have good performance.

Returning to FIG. 12, after the first dielectric film 240 is formed, a first dielectric layer 241 is formed by etching back the first dielectric film 240 until the surface of the substrate 200 at the second region B is exposed (S203). FIG. 7 illustrates a corresponding semiconductor structure. A process of etching back the first dielectric film 240 includes a wet etching process, a dry etching process or a SICONI process.

In one embodiment, the process of etching back the first dielectric film 240 includes etching the first dielectric film 240 by using a first dry etching process until the surface of the substrate 200 at the second region B is exposed. After the surface of the substrate 200 at the second region B is exposed, the first dielectric layer 241 is formed by thinning the first dielectric film 240 located on the sidewall surfaces of the fins 210 using a second etching process.

The first dry etching process includes following parameters. Gases used include $CF_4$, $CF_6$, $O_2$, and $N_2$. Flow rates of the $CF_4$ and the $CF_6$ are in a range of approximately 10 standard milliliters per minute to 300 standard milliliters per minute, and a flow rate of the $O_2$ is in a range of approximately 10 standard milliliters per minute to 500 standard milliliters per minute. A flow rate of the $N_2$ is in a range of approximately 50 standard milliliters per minute to 1000 minutes per minute. A pressure is in a range of approximately 3 millitorr to 400 millitorr, and a temperature is in a range of approximately 30 degrees Celsius to 120 degrees Celsius.

In one embodiment, the second etching process is a SICONI process. The SICONI process includes following parameters. Gases used include $NF_3$ and $NH_3$, and flow rates of the $NF_3$ and the $NH_3$ are in a range of approximately 100 standard milliliters per minute to 5000 standard milliliters per minute. A temperature is in a range of approximately 0 degrees Celsius to 100 degrees Celsius.

The SICONI process may thin the first dielectric film 240 on the sidewall surfaces of the fins 210. Accordingly, the first dielectric layer 241 may be used as a mask in a subsequent etching process, such that a first groove may be formed in the substrate 200 at the second region B.

In some other embodiments, a process of etching back the first dielectric film to form the first dielectric layer only includes performing a first dry etching process until the surface of the substrate at the second region is exposed.

The first dielectric film 240 is located on the surface of the substrate at the second region B. The substrate at the second region B 200 has a flat surface, and the first dielectric film 240 formed on the surface of the substrate 200 at the second region B by the atomic layer deposition process may have a good appearance. Accordingly, the first dielectric layer 241 formed by etching back the first dielectric film 240 may have a good appearance and a large thickness.

The first dielectric layer 241 may be used as a mask for subsequently forming a first groove in the substrate 200 at the second region B.

Figure 8:
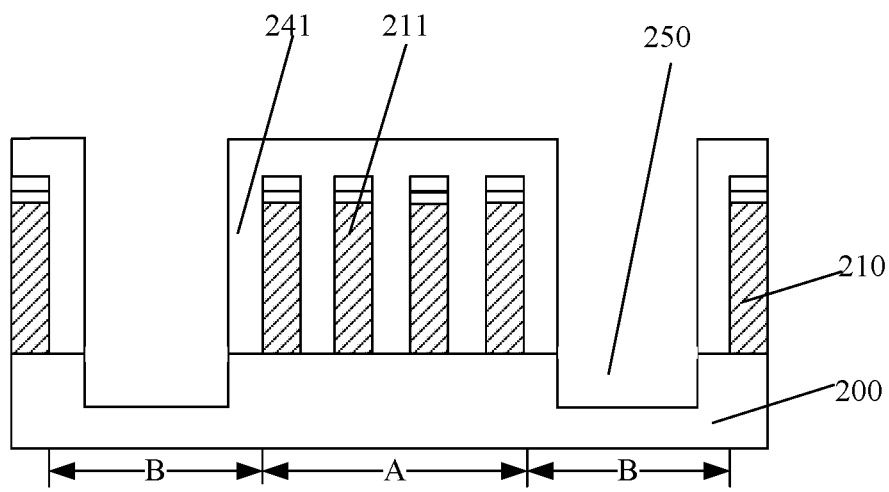

Returning to FIG. 12, after the first dielectric layer 241 is formed, a first groove 250 is formed in the substrate 200 at the second region B by etching the substrate 200 at the second region B with the first dielectric layer 241 as a mask (S204). FIG. 8 illustrates a corresponding semiconductor structure.

A process of etching the substrate 200 at the second region B with the first dielectric layer 241 as the mask includes one or a combination of a wet etching process and a dry etching process.

In one embodiment, the process of etching the substrate 200 at the second region B includes one or a combination of a wet etching process or a dry etching process.

The first groove 250 is formed by etching the substrate 200 at the second region B with the first dielectric layer 241 located at the second region B as the mask. Since the first dielectric layer 241 located at the second region B may have a good appearance, the first groove 250 formed in the substrate 200 at the second region B by etching the substrate with the first dielectric layer 241 as the mask may have a good appearance. Thus, performance of the semiconductor structure may be improved.

Figure 9:
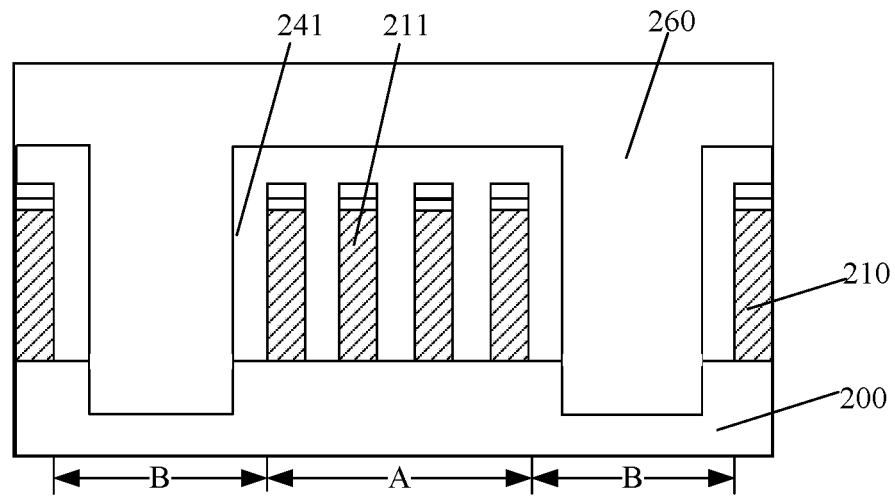

After the first groove is formed, a second groove may be formed in the substrate at the first region by removing a fin to-be-removed and a portion of the substrate located at the bottom of the fin to-be-removed. FIGS. 9 to 11 illustrate semiconductor structures at certain stages corresponding to a process of forming the second groove, and the process of forming the second groove is described below in detail.

Returning to FIG. 12, after the first groove 250 is formed, a second dielectric layer 260 is formed on surfaces and sidewalls of the first dielectric layer 241 and in the first groove 250 (S205). FIG. 9 illustrates a corresponding semiconductor structure. As shown in FIG. 9, a top surface of the second dielectric layer 260 is higher than the top surfaces of the fins 210.

The second dielectric layer 260 may be made of an organic material. A process of forming the second dielectric layer 260 includes a spin coating process.

In one embodiment, the second dielectric layer 260 is a bottom anti-reflective coating.

The second dielectric layer 260 may have a flat surface, and a first mask layer may be formed on the surface of the second dielectric layer 260.

Returning to FIG. 12, after the second dielectric layer 260 is formed, a first mask layer 270 is formed on the surface of the second dielectric layer 260 (S206). FIG. 10 illustrates a corresponding semiconductor structure. As shown in FIG. 10, the first mask layer 270 exposes a surface of the second dielectric layer 260 on the fin to-be-removed 211.

The first mask layer 270 may be made of a material including silicon oxide, silicon nitride, silicon carbonitride, silicon carbide, aluminum oxide, hafnium oxide, silicon oxynitride or silicon oxycarbide. In one embodiment, the first mask layer 270 is made of silicon nitride.

A process of forming the first mask layer 270 includes a chemical vapor deposition process or a physical vapor deposition process.

The first mask layer 270 may be used as a mask for subsequently forming a second groove.

Returning to FIG. 12, after the first mask layer 270 is formed, a second groove 280 is formed in the substrate 200 at the first region A (S207). FIG. 11 illustrates a corresponding semiconductor structure. Referring to FIG. 11, the second groove 280 may be formed by etching the second dielectric layer 260, the first dielectric layer 241, the fin to-be-removed 211, and a portion of the substrate 200 at the first region A at the bottom of the fin to-be-removed 211, using the first mask layer 270 as a mask.

In one embodiment, the second groove 280 is formed in the substrate 200 at the first region A by removing one fin to-be-removed 211 and a portion of the substrate 200 at the first region A at the bottom of the fin to-be-removed 211.

An etching process, for etching the second dielectric layer 260, the first dielectric layer 241, the fin to-be-removed 211, and the portion of the substrate 200 at the first region A at the bottom of the fin to-be-removed 211 by using the first mask layer 270 as the mask, includes one or a combination of a dry etching process and a wet etching process.

In one embodiment, when the etching process is a dry etching process, the dry etching process includes following parameters. Gases used include $CF_4$, $CF_6$, $O_2$, $N_2$, HBr and $Cl_2$. Flow rates of the $CF_4$ and the $CF_6$ are in a range of approximately 10 standard milliliters per minute to 300 standard milliliters per minute, a flow rate the $O_2$ is in a range of approximately 10 standard milliliters per minute to 500 standard milliliters per minute, a flow rate of the $N_2$ is in a range of approximately 50 standard milliliters per minute to 1000 standard milliliters per minute, a flow rate of the HBr is in a range of approximately 10 standard milliliters per minute to 500 standard milliliters per minute, and a flow rate of the $Cl_2$ is in a range of approximately 10 standard milliliters per minute to 500 standard milliliters per minute. A pressure is in a range of approximately 3 millitorr to 400 millitorr, and a temperature is in a range of approximately 30 degrees Celsius to 120 degrees Celsius.

In one embodiment, the second groove 280 is formed by a single etching process. By the single etching process using the single first mask layer 270 as the mask, enhancement of appearance defects of the second groove 280 caused by multiple etching processes may be avoided. Accordingly, the second groove 280 may have a good appearance, and thus performance of the semiconductor structure may be improved.

In summary, the present disclosure proposes a step-by-step etching process. The first groove 250 in the substrate 200 at the second region B is formed first, and then the second groove 280 in the substrate 200 at the first region A is formed. The first groove 250 and the second groove 280 may have different dimensions along the first direction, and the first groove 250 and the second groove 280 may both have a good appearance. Accordingly, the semiconductor structure formed may have good performance.

Correspondingly, the present disclosure also provides a semiconductor structure formed by the method provided by the present disclosure.

As disclosed, the technical solutions of the present disclosure have the following advantages.

In the method of forming a semiconductor structure provided by the present disclosure, a first groove is formed in a substrate at a second region by etching the substrate at the second region with a first dielectric layer as a mask. A second groove is formed in the substrate at a first region by removing a fin to-be-removed and a portion of the substrate at a bottom of the fin to-be-removed. Since the first groove is formed by etching the substrate using the first dielectric layer at the second region as the mask, and the first dielectric layer at the second region may have a good appearance, the first groove having a good appearance may be formed in the substrate at the second region by etching the substrate with the first dielectric layer as the mask. Accordingly, performance of the semiconductor structure may be improved. Meanwhile, the second groove is formed by a single etching process, and enhancement of appearance defects of the second groove caused by multiple etching processes may be avoided. Accordingly, the second groove may have a good appearance, and thus performance of the semiconductor structure may be improved.

The first groove and the second groove are formed step by step. First, the first groove is formed in the substrate at the second region, and then the second groove is formed in the substrate at the first region. Accordingly, dimensions of the first groove and the second groove in a first direction may be different, and both the first groove and the second groove may have a good appearance. Thus, the semiconductor structure formed may have good performance.

Further, a process of forming a first dielectric film includes an atomic layer deposition process. Since a film formed by the atomic layer deposition process may have a good step coverage, by using the atomic layer deposition process, the first dielectric film formed may be thick enough to fill first openings between fins at the first region. Moreover, a first dielectric layer having a good appearance and a large thickness may be subsequently formed by etching back the first dielectric film. Accordingly, when an etching process is performed by using the first dielectric layer as a mask, the first groove formed in the substrate at the second region may have a good appearance, and the semiconductor structure formed may thus have good performance.

The embodiments disclosed herein are exemplary only and not limiting the scope of this disclosure. Various combinations, alternations, modifications, or equivalents to the technical solutions of the disclosed embodiments can be obvious to those skilled in the art and can be included in this disclosure. Without departing from the spirit and scope of this disclosure, such other modifications, equivalents, or improvements to the disclosed embodiments are intended to be encompassed within the scope of the present disclosure.

What is claimed is:

1. A method of forming a semiconductor structure, comprising:
    providing a substrate, wherein the substrate includes a first region and a second region that are adjacent to each other, the first region and the second region are arranged in a first direction and the first direction is parallel to a surface of the substrate in the first region;
    providing a plurality of fins on the substrate at the first region, wherein first openings are located between adjacent fins, a width of the second region is larger than a width of a first opening in the first direction, and the plurality of fins includes fins to-be-removed;
    forming a first dielectric layer on sidewalls of the plurality of fins, wherein the first dielectric layer fills the first openings, wherein the first dielectric layer exposes a portion of a surface of the substrate in the second region, and forming the first dielectric layer comprises:
        forming a first dielectric film on the surface of the substrate, tops and the sidewalls of the plurality of fins, wherein the first dielectric film fills the first openings; and
        forming the first dielectric layer by etching back the first dielectric film until the surface of the substrate at the second region is exposed, wherein etching back the first dielectric film comprises etching the first dielectric film by using a first dry etching process until the surface of the substrate at the second region is exposed, wherein in the first dry etching process:
    gases used include $CF_4$, $CF_6$, $O_2$, and $N_2$;
    flow rates of the $CF_4$ and the $CF_6$ are in a range of 10 standard milliliters per minute to 300 standard milliliters per minute;
    a flow rate of the $O_2$ is in a range of 10 standard milliliters per minute to 500 standard milliliters per minute;
    a flow rate of the $N_2$ is in a range of 50 standard milliliters per minute to 1000 minutes per minute;
    a pressure is in a range of 3 millitorr to 400 millitorr; and
    a temperature is in a range of 30 degrees Celsius to 120 degrees Celsius;
    forming a first groove in the substrate at the second region by etching the portion of the surface of the substrate at the second region using the first dielectric layer as a mask; and
    after forming the first groove, forming a second groove in the substrate at the first region by removing the fins to-be-removed and a portion of the substrate located at bottoms of the fins to-be-removed, wherein the second groove and the first groove are isolated from each other by remaining fins of the plurality of fins on the substrate at the first region.

2. The method according to claim 1, wherein etching back the first dielectric film further comprises, after the surface of the substrate at the second region is exposed, thinning the first dielectric film located on sidewall surfaces of the plurality of fins using a second etching process, wherein the second etching process is a SICONI process, in the SICONI process:
    gases used include $NF_3$ and $NH_3$, and flow rates of the $NF_3$ and the $NH_3$ are in a range of approximately 100 standard milliliters per minute to 5000 standard milliliters per minute; and
    a temperature is in a range of approximately 0 degrees Celsius to 100 degrees Celsius.

3. The method according to claim 1, wherein forming the first dielectric film includes an atomic layer deposition process.

4. The method according to claim 1, wherein the first dielectric film has a thickness in a range of 1 nm to 10 nm, and the first openings between the plurality of fins have a width in a range of 1 nm to 10 nm.

5. The method according to claim 1, wherein the first dielectric layer is made of a material including silicon oxide, silicon nitride, silicon carbonitride, silicon carbide, aluminum oxide, hafnium oxide, silicon oxynitride, silicon oxycarbide, or a combination thereof.

6. The method according to claim 1, wherein etching the substrate at the second region with the first dielectric layer as the mask includes one or a combination of a wet etching process and a dry etching process.

7. The method according to claim 1, wherein forming the second groove comprises:
    forming a second dielectric layer on surfaces and sidewalls of the first dielectric layer and in the first groove, wherein a top surface of the second dielectric layer is higher than top surfaces of the plurality of fins;
    forming a first mask layer on the top surface of the second dielectric layer, wherein the first mask layer exposes a portion of the top surface of the second dielectric layer on the fins to-be-removed; and
    forming the second groove in the substrate at the first region by etching the second dielectric layer, the first dielectric layer, the fins to-be-removed, and a portion of the substrate at the first region at bottoms of the fins to-be-removed, using the first mask layer as a mask.

8. The method according to claim 7, wherein the second dielectric layer is made of an organic material.

9. The method according to claim 7, wherein forming the second dielectric layer includes a spin coating process.

10. The method according to claim 7, wherein etching the second dielectric layer, the first dielectric layer, the fins to-be-removed, and the portion of the substrate at the first region at the bottoms of the fins to-be-removed, using the first mask layer as the mask includes one or a combination of a dry etching process and a wet etching process.

11. The method according to claim 10, wherein in the dry etching process:
    gases used include $CF_4$, $CF_6$, $O_2$, $N_2$, HBr and $Cl_2$;
    flow rates of the $CF_4$ and the $CF_6$ are in a range of 10 standard milliliters per minute to 300 standard milliliters per minute;
    a flow rate the $O_2$ is in a range of 10 standard milliliters per minute to 500 standard milliliters per minute;

a flow rate of the $N_2$ is in a range of 50 standard milliliters per minute to 1000 standard milliliters per minute;

a flow rate of the HBr is in a range of 10 standard milliliters per minute to 500 standard milliliters per minute;

a flow rate of the $Cl_2$ is in a range of 10 standard milliliters per minute to 500 standard milliliters per minute;

a pressure is in a range of 3 millitorr to 400 millitorr; and a temperature is in a range of 30 degrees Celsius to 120 degrees Celsius.

12. The method according to claim 7, wherein the second groove is formed by a single etching process.

13. The method according to claim 1, wherein the plurality of fins includes one fin to-be-removed or a plurality of fins to-be-removed.

14. The method according to claim 1, wherein first protective layers are disposed on top surfaces of the plurality of fins, and second protective layers are disposed on surfaces of the first protective layers.

15. The method according to claim 14, wherein:
the first protective layer is made of a material including silicon oxide, silicon nitride, silicon carbonitride, silicon carbide, aluminum oxide, hafnium oxide, silicon oxynitride, silicon oxycarbide, or a combination thereof;
the second protective layer is made of a material including silicon oxide, silicon nitride, silicon carbonitride, silicon carbide, aluminum oxide, hafnium oxide, silicon oxynitride or silicon oxycarbide, or a combination thereof; and
the second protective layer and the first protective layer are made of different materials.

16. A semiconductor structure, wherein the semiconductor structure is formed by a method comprising:
providing a substrate, wherein the substrate includes a first region and a second region that are adjacent to each other, the first region and the second region are arranged in a first direction and the first direction is parallel to a surface of the substrate in the first region;
providing a plurality of fins on the substrate at the first region, wherein first openings are located between adjacent fins, a width of the second region is larger than a width of a first opening in the first direction, and the plurality of fins includes fins to-be-removed;
forming a first dielectric layer on sidewalls of the plurality of fins, wherein the first dielectric layer fills the first openings, wherein the first dielectric layer exposes a portion of the surface of the substrate in the second region, and forming the first dielectric layer comprises:
forming a first dielectric film on the surface of the substrate, tops and the sidewalls of the plurality of fins, wherein the first dielectric film fills the first openings; and
forming the first dielectric layer by etching back the first dielectric film until the surface of the substrate at the second region is exposed, wherein etching back the first dielectric film comprises etching the first dielectric film by using a first dry etching process until the surface of the substrate at the second region is exposed, wherein in the first dry etching process:
gases used include $CF_4$, $CF_6$, $O_2$, and $N_2$;
flow rates of the $CF_4$ and the $CF_6$ are in a range of 10 standard milliliters per minute to 300 standard milliliters per minute;
a flow rate of the $O_2$ is in a range of 10 standard milliliters per minute to 500 standard milliliters per minute;
a flow rate of the $N_2$ is in a range of 50 standard milliliters per minute to 1000 minutes per minute;
a pressure is in a range of 3 millitorr to 400 millitorr; and
a temperature is in a range of 30 degrees Celsius to 120 degrees Celsius;
forming a first groove in the substrate at the second region by etching the portion of the surface of the substrate at the second region using the first dielectric layer as a mask; and
after forming the first groove, forming a second groove in the substrate at the first region by removing the fins to-be-removed and a portion of the substrate located at bottoms of the fins to-be-removed, wherein the second groove and the first groove are isolated from each other by remaining fins of the plurality of fins on the substrate at the first region.

17. The method according to claim 1, wherein the first dielectric film is conformally formed on tops and the sidewalls of the plurality of fins, the surface of the substrate in the first region, and the surface of the substrate in the second region.

18. The method according to claim 1, wherein no fins are formed on the substrate in the second region.

* * * * *